(12) United States Patent
Pesce et al.

(10) Patent No.: US 6,216,254 B1
(45) Date of Patent: Apr. 10, 2001

(54) INTEGRATED CIRCUIT DESIGN USING A FREQUENCY SYNTHESIZER THAT AUTOMATICALLY ENSURES TESTABILITY

(75) Inventors: Michael S. Pesce; Kevin J. Gearhardt, both of Fort Collins; Jonathan P. Kuppinger, Windsor, all of CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/212,769

(22) Filed: Dec. 16, 1998

(51) Int. Cl.[7] .............................. G06F 17/50; G06F 7/38; H03K 19/00; G01R 23/02
(52) U.S. Cl. ..................... 716/5; 716/4; 716/2; 716/7; 716/16; 326/16; 326/39; 713/500; 324/76.39; 324/76.41; 324/76.53; 714/72
(58) Field of Search ............................... 377/47; 375/327; 714/733; 455/226.1

(56) References Cited

U.S. PATENT DOCUMENTS

| | | | |
|---|---|---|---|
| 4,477,919 | * 10/1984 | Borras et al. | 377/47 |
| 4,701,920 | * 10/1987 | Resnick et al. | 714/733 |
| 4,795,963 | 1/1989 | Ueno et al. | 324/57 |
| 5,055,800 | 10/1991 | Black et al. | 331/1 A |
| 5,125,107 | * 6/1992 | Herold et al. | 455/226.1 |
| 5,336,939 | 8/1994 | Eitrheim et al. | 307/269 |
| 5,422,911 | * 6/1995 | Barrett, Jr. et al. | 375/327 |
| 5,473,651 | 12/1995 | Guzinski et al. | 377/29 |

* cited by examiner

Primary Examiner—Matthew Smith
Assistant Examiner—Jibreel Speight (57) ABSTRACT

A system for designing integrated circuits that use frequency synthesizers to ensure testability. A testability circuit is added or connected to the frequency synthesizer that will receive allow the integrated circuit to operate in a system mode for normal function and in a test mode during testing. In the test mode, the testability circuit will inhibit the reset signal from initializing the integrated circuit until the frequency synthesizer has reached phase lock. The testability circuit may be implemented as a component in the frequency synthesizer cell in an ASIC design system such that anytime the frequency synthesizer is used, the integrated circuit is testable.

14 Claims, 4 Drawing Sheets

INTEGRATED CIRCUIT DESIGN USING A FREQUENCY SYNTHESIZER THAT AUTOMATICALLY ENSURES TESTABILITY

BACKGROUND OF THE INVENTION

A. Field of the Invention

The present invention relates the field of integrated circuits, and more particularly, to the design of integrated circuits.

B. Description of Related Art

Computer-based tools have simplified the design and manufacturing processes in the development of integrated circuits. Such tools have made the large scale development and manufacture of application specific integrated circuits (ASIC) possible. An ASIC is an integrated circuit, or "chip," that has been built for a specific application. Most integrated circuits have general functions, such as combinational logic, shift registers, etc., and are connected to one another on circuit boards. ASICS include such general function circuits that are connected to perform specific applications as systems, such as, a disk controller, a communications protocol, a bus interface, a voice coder, etc. ASICS may include on a single integrated circuit the circuitry that is typically built on a circuit board.

Computer-based tools that ease the process of placing components and routing connections between the components in meaningful integrated circuit layouts may significantly shorten the process of designing ASICS. The use of library of cells, or computer representations or models, of general-purpose circuits and a user interface that has access to the cells in computer-based tools has simplified the routing of connections between ASICS.

The cells may include information about the circuit represented by the cell. The information may be used to verify the correctness of the layout and other aspects of the circuit design. The cells may include information about the inputs, the outputs, the functions of the circuit and any design rules that the tool may use to verify the layout during the design process. The cells may represent circuits having many functions such that entire systems may be designed and manufactured on a semiconductor chip.

One advantage of using computer-based tools to design integrated circuits is that many have simulation capabilities. Integrated circuits may be tested using simulation tools that operate while the integrated circuit is still in layout form, before any prototypes are built.

In addition, computer-based tools make the manufacturing process easier by standardizing the output that is used to specify integrated circuit wafers. Designs may be downloaded to a standard file format and sent to silicon foundries that support that format for manufacture. The testing process may also be made easier by computer-based tools. Automatic test equipment of all types exist to test systems designed on an ASIC or any general integrated circuit.

One problem with computer-based tools is that much of the reliability of the system depends upon the designer and the features of the tools. Guidelines exist to ensure that the ASICS designed are testable and manufacturable. However, there is no way to ascertain that such guidelines are followed.

For example, many ASICS use frequency synthesizers to provide synchronization of events through the generation of one or more frequencies. The frequencies that are being used in ASICS may now exceed 400 MHz. This is a problem because many of the automatic test equipment are not capable of testing systems at higher than 50 MHz. Such test equipment is expensive and difficult to keep current with the technology, which makes manufacturers reluctant to replace test equipment that already works.

ASICS that use frequency synthesizers are typically tested in a couple of ways. First, the circuitry not including the frequency synthesizer is tested in a bypass mode. In the bypass mode, the frequency synthesizer is bypassed and the tester clock is connected to the circuitry excluding the frequency synthesizer. Test patterns generated in this manner may verify the operability of the circuitry.

The circuitry is then tested with frequency synthesizer by using the frequency synthesizer to drive the remaining circuitry to generate test patterns from certain integrated circuit pins to verify the operation of the frequency synthesizer. For this test to work properly, however, the frequency synthesizer must output a phase-locked frequency, that is, the frequency output must be stable. Typically, a phase-lock detect signal is made available to the tester as feedback for when the valid generation of test patterns may begin. Designers may not always make such a signal available. In addition, other guidelines for ensuring the testability of integrated circuits may not have been followed.

It would be desirable to ensure the testability of an integrated circuit automatically, without requiring the designer to follow addition steps or guidelines.

SUMMARY OF THE INVENTION

In view of the above, an improved system for designing integrated circuits is provided. The integrated circuit includes a frequency synthesizer, a master reset input and a function circuit. The frequency synthesizer includes a plurality of frequency outputs for outputting a plurality of output frequency signals generated from a reference frequency at a reference frequency input. The frequency synthesizer generates a lock signal to indicate that one of the output frequency signals is synchronous to the reference frequency. The master reset input is coupled to a reset signal source for receiving a master reset signal to initialize the integrated circuit. The function circuit includes a function reset input for receiving a function reset signal, and a plurality of frequency inputs for receiving at least one of the plurality of output frequency signals from the frequency synthesizer.

The system further includes a testability circuit having a test mode for testing the integrated circuit. In the testability circuit, a reset input is included for receiving the master reset signal. In addition, a reset controller is included for coupling a reset out signal to the function reset input when in the test mode, when the frequency synthesizer generates the lock signal and when the master reset signal is received.

BRIEF DESCRIPTION OF THE DRAWINGS

Presently preferred embodiments of the invention are described below in conjunction with the appended drawing figures, wherein like reference numerals refer to like elements in the various figures, and wherein.

DETAILED DESCRIPTION OF THE PREFERRED EMBODIMENT

Figure 1:
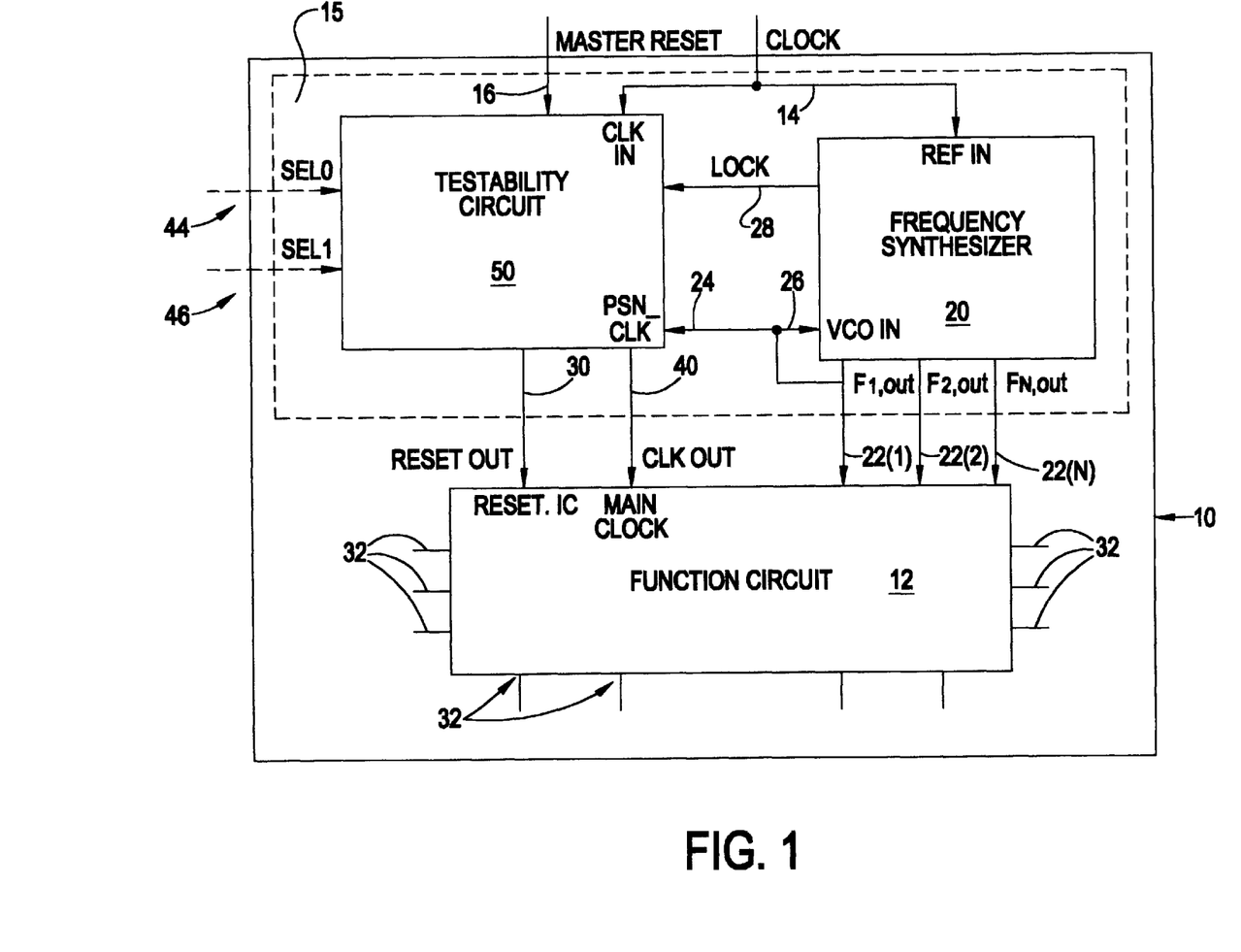
FIG. 1 is a schematic representation of an integrated circuit of the type in which the present invention finds advantageous use.

FIG. 1 is a schematic diagram showing an integrated circuit 10 having a function circuit 12, a frequency synthesizer 20 and a testability circuit 50. Embodiments in the present invention find particularly advantageous use when the integrated circuit 10 is an application specific integrated circuit (ASIC), which is an integrated circuit that has been built for a specific application. Integrated circuits are traditionally designed with general purpose functions that allow designers to design systems in the form of integrated circuit boards by connecting integrated circuits with selected functions to one another. Designers may use ASIC to consolidate many integrated circuits into a single package thereby reducing circuit board size requirements and power consumption. ASICS may incorporate programmable logic arrays, field programmable gate arrays, cell based devices, and fully custom designed devices.

The integrated circuit 10 is preferably an ASIC that includes cell-based devices, or devices represented as cells. The cells may include design blocks for representing circuits in computer based design tools. Integrated circuit 10 in FIG. 1 may be represented on a computer based design tool (described with reference to FIG. 4) using design blocks for the testability circuit 50, the frequency synthesizer 20, and the function circuit 12. The testability circuit 50 may also be included as a component of the frequency synthesizer 20 and represented as a single frequency synthesizer design block 15. The single frequency synthesizer design block 15 has the advantage of insuring that integrated circuit 10 will be testable because the testability function of the testability circuit 50 is built into the frequency synthesizer 15. The testability function is used any time the frequency synthesizer function is used.

The function circuit 12 includes circuitry required to perform any function desired by a designer of an integrated circuit 10. The function circuit 12 may include processing circuitry, memory, digital filters, combinational logic, counters, registers and any other integrated circuit or integrated circuit component needed to perform the function or functions desired by the designer. While FIG. 1 shows the function circuit 12 as one block, those of ordinary skill in the art will appreciate that many function blocks can be used, and thus, can be represented by the block representing the function circuit 12. The function circuit 12 includes pins or ports 32 for outputting signals to other circuitry to which it may be connected (not shown) or to pins and ports on the integrated circuit 10.

The function circuit 12 includes a reset input for receiving a reset signal at connection 30 and a main clock input for receiving a clock signal at connection 40. The function circuit 12 also includes one or more frequency inputs, $F_1$, $F_2$, ... $F_N$. The frequency inputs receive frequencies $F_{1,out}$, $F_{2,out}$, ..., $F_{N,out}$ from the frequency synthesizer 20 at connections 22(1), 22(2), ... 22(N), respectively. It is to be understood by one of ordinary skill in the art that the precise function or functions performed by the function circuit 12 or by the integrated circuit 10 are not pertinent to the implementation of embodiments of the present invention. The function circuit 12 may be any circuit performing any function that makes advantageous use of a frequency synthesizer.

The frequency synthesizer 20 is preferably a complete frequency synthesizer phase-locked loop having multiple phased balanced output frequencies $F_1$, $F_2$, ... $F_N$. The frequency synthesizer 20 may be used to generate a programmable clock source that is frequency and phase-locked to a highly referenced source such as a crystal oscillator. The crystal oscillator preferably resides external to the integrated circuit, although the location of the crystal oscillator is unimportant. The frequency synthesizer 20 may be used with digital counters in order to obtain a complete frequency synthesis function. The counters may be included in the cell; however, the frequency synthesizer 20 preferably does not include the counters since their implementation tends to be application-specific. In the integrated circuit 10 shown in FIG. 1, the counters used to complete the frequency synthesis function are included in the function circuit 12.

The frequency synthesizer 20 includes a reference input for receiving a system clock signal at connection 14. The frequency synthesizer 20 uses a sequential logic phase/frequency detector for indicating when phase-lock has been attained. The phase/frequency detector detects phase-lock by comparing the reference frequency with a feedback frequency, $F_{1,out}$. The feedback frequency $F_{1,out}$ is input into a voltage controlled oscillator input, VCOIN on the frequency synthesizer 20. In the frequency synthesizer 20 in FIG. 1, the phase lock is indicated by outputting the lock signal at connection 28.

The testability circuit 50 includes an input for receiving a master reset signal at connection 16 and a clock input for receiving the system clock signal at connection 14. The testability circuit 50 also includes a frequency synthesizer clock input for receiving the frequency $F_{1,out}$ from the frequency synthesizer 20 at connection 24. The frequency $F_{1,out}$ is coupled to the voltage controlled oscillator input of the frequency synthesizer 20 at connection 26. The voltage controlled oscillator input VCOIN of the frequency synthesizer 20 is compared with the referenced frequency received at the referenced frequency input to determine when the phase lock loop has achieved the phase-lock state.

The testability circuit 50 uses select inputs SEL0 and SEL1 to set an operation mode for the integrated circuit 10. The operation mode may include any number of test modes for testing any function and circuit in the integrated circuit 10. In a preferred embodiment, the testability circuit 50 includes a by-pass mode, a testability mode and a system mode. The by-pass mode permits the testing of the integrated circuit using automatic test equipment that may not be able to support the frequencies generated by the frequency synthesizer. In the by-pass mode, the frequency outputs of the frequency synthesizer 20 are not coupled to the function circuit 12. Any necessary clock signals may be provided by an external oscillator or a frequency generated by the automatic test equipment.

In the testability mode, the output frequencies of the frequency synthesizer 20 are coupled to the function circuit 12. The integrated circuit 10 is then provided with signals at its inputs and other control ports, or pins, that will generate desired test patterns at the outputs or other pins to the integrated circuit 10. In a testability mode, the clock signal from the frequency synthesizer 20 is coupled to the function circuit 12 to provide an at-speed test. The at-speed test may include a simulation of various circuits, components and functions in the integrated circuit 10. Test patterns may be generated by the at-speed test to determine the operability of the integrated circuit 10 during manufacturing. The test patterns are determined by the function of the integrated circuit 10.

In the system mode of operation, the integrated circuit performs the targeted system application for which the integrated circuit was designed.

Figure 2:
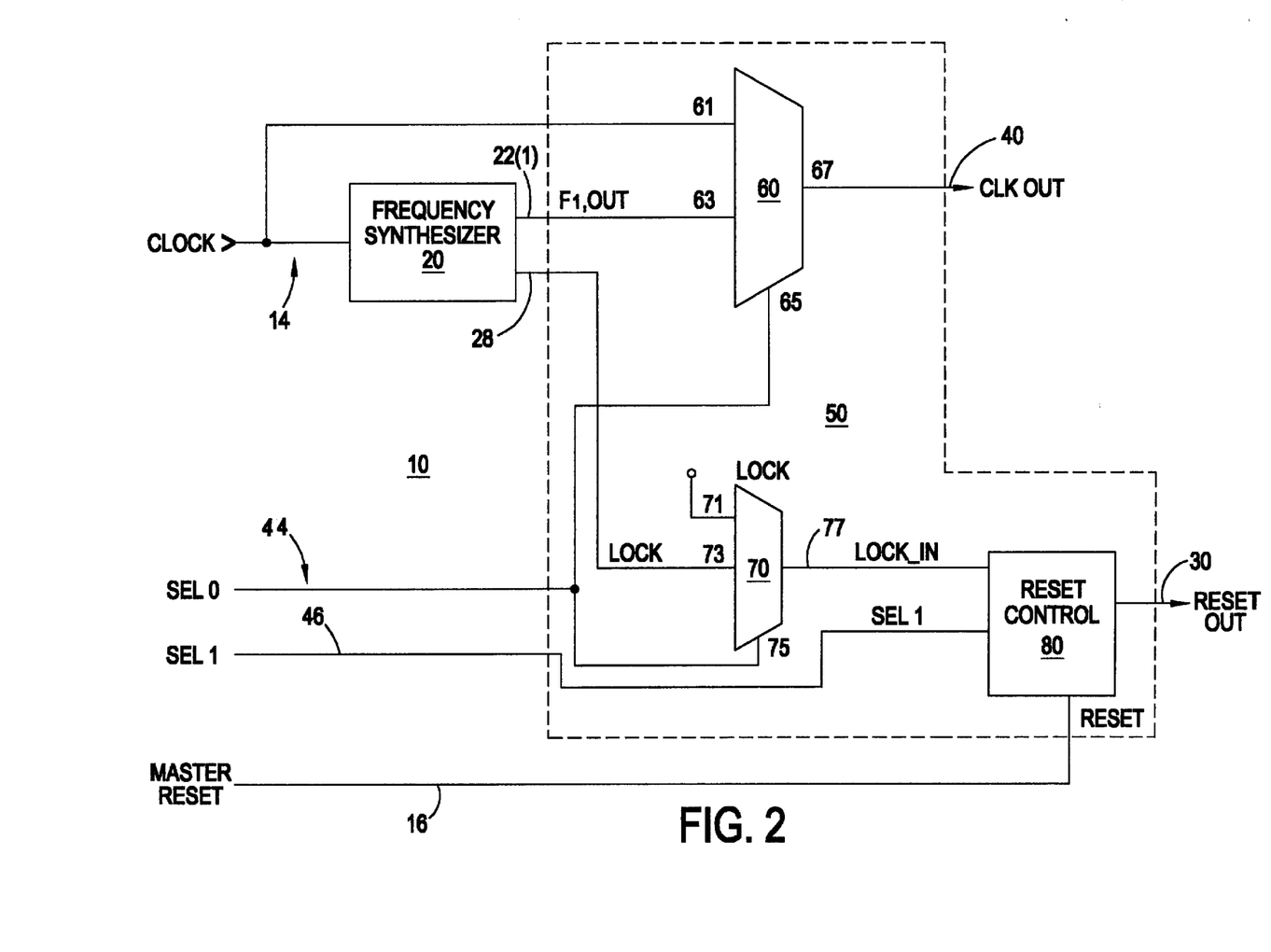
FIG. 2 is a schematic representation of a circuit for insuring the testability of the integrated circuit in FIG. 1 according to preferred embodiment of the present invention.

FIG. 2 is a schematic diagram of an example of an implementation of the testability circuit 50 according to a preferred embodiment of the present invention. The testability circuit 50 in FIG. 2 includes a first multiplexer 60, a second multiplexer 70, and a reset control circuit 80. The first multiplexer 60 receives a master clock signal from connection 14 at a first input 61 and a feedback frequency $F_{1,out}$ from connection 22(1), at a second input 63. The first multiplexer 60 receives a control signal at a control input 65, from the first select input SEL0 at connection 44. The control signal is used to couple either the first input 61 or the second input to a first mux output 67 of the first multiplexer 60. A '0' state at the control input 65 selects the first input 61 and a '1' state selects the second input 63.

The second multiplexer 70 is held to a logic state that simulates the phase-lock state of the frequency synthesizer 20 at a first input 71 and receives the lock signal from the frequency synthesizer 20 at connection 28 at a second input 73. The second multiplexer 70 receives a control signal at a control input 75, from the first select input SEL0 at connection 44. The control signal is used to couple either the first input 71 or the second input 73 to the output 77 of the second multiplexer 70. The signal that is output from the second mux output 77 is a LOCK_IN signal which indicates a true phase-lock state when the second input 73 to the second multiplexer 70 is selected, or a simulated phase-lock state when the first input 71 is selected.

The reset control circuit 80 receives the LOCK_IN signal from the second multiplexer 70, the second select input SEL1 and the master reset signal from connection 16. The reset control circuit 80 outputs a reset signal at connection 30 to the function circuit 12 to trigger a reset when a phase lock is detected at the frequency synthesizer 20. If the simulated phase-lock state is coupled to the reset circuit 80 through the LOCK_IN signal, the reset signal at connection 30 follows the master reset from connection 16.

The operation of the testability circuit 50 in FIG. 2 may conform to modes selected by the select inputs SEL0, SEL1. Table 1 shows a truth table describing the by-pass, testability and system modes and the states of the select inputs necessary according to a preferred embodiment.

TABLE 1

| SEL0 | SEL1 | MODE | Description |
| --- | --- | --- | --- |
| 0 | 0 | Not Used | Not used, but same functionality as BYPASS mode. |
| 0 | 1 | BYPASS | System clock bypasses frequency synthesizer 20. |
| 1 | 0 | TESTABILITY | Frequency synthesizer 20 clock output is used for at-speed tests. |
| 1 | 1 | SYSTEM | Testability logic bypassed for system application. |

As shown in Table 1, the by-pass mode is selected whenever select input SEL0 is logic '0'. In the by-pass mode, SEL0 selects the lock signal received from the first input 61 and deselects the clock input received from the frequency synthesizer 20 at the second input 63. In addition, the '0' at the first select at SEL0 selects the first input 71 of the second multiplexer 70 which couples the lock signal at the LOCK_IN input of the reset control circuit 80. The reset output at connection 30 follows the master reset coming in from connection 16.

As shown in Table 1, the testability mode is selected when the first select input SEL0 is logic '1' and the second select input SEL1 is a '0'. The selection of a logic '1' at the first select input SEL0 selects the $F_{1,out}$ frequency from the frequency synthesizer 20 at the second input 63. This causes the clock output at connection 40 to conduct a clock signal from the frequency synthesizer 20. The logic '1' at the first select input SEL0 also causes the second multiplexer 70 to couple the lock signal from the frequency synthesizer 20 at the second input 73 to the LOCK_IN input of the reset control circuit 80. This causes the LOCK_IN signal of the reset control circuit 80 to be determined by the lock output of the frequency synthesizer 20. The second select input SEL1 is set to 0 to trigger the reset control circuit 80 to generate the reset output at connection 30 to follow the lock input at reset control circuit 80. As shown in FIG. 2, the testability mode permits the frequency synthesizer 20 to provide a clock signal at the clock output in connection 40 while the reset control circuit 80 insures that the reset output at connection 30 is not generated to the function circuit 12 until the lock state is detected in the frequency synthesizer 20.

Figure 3:
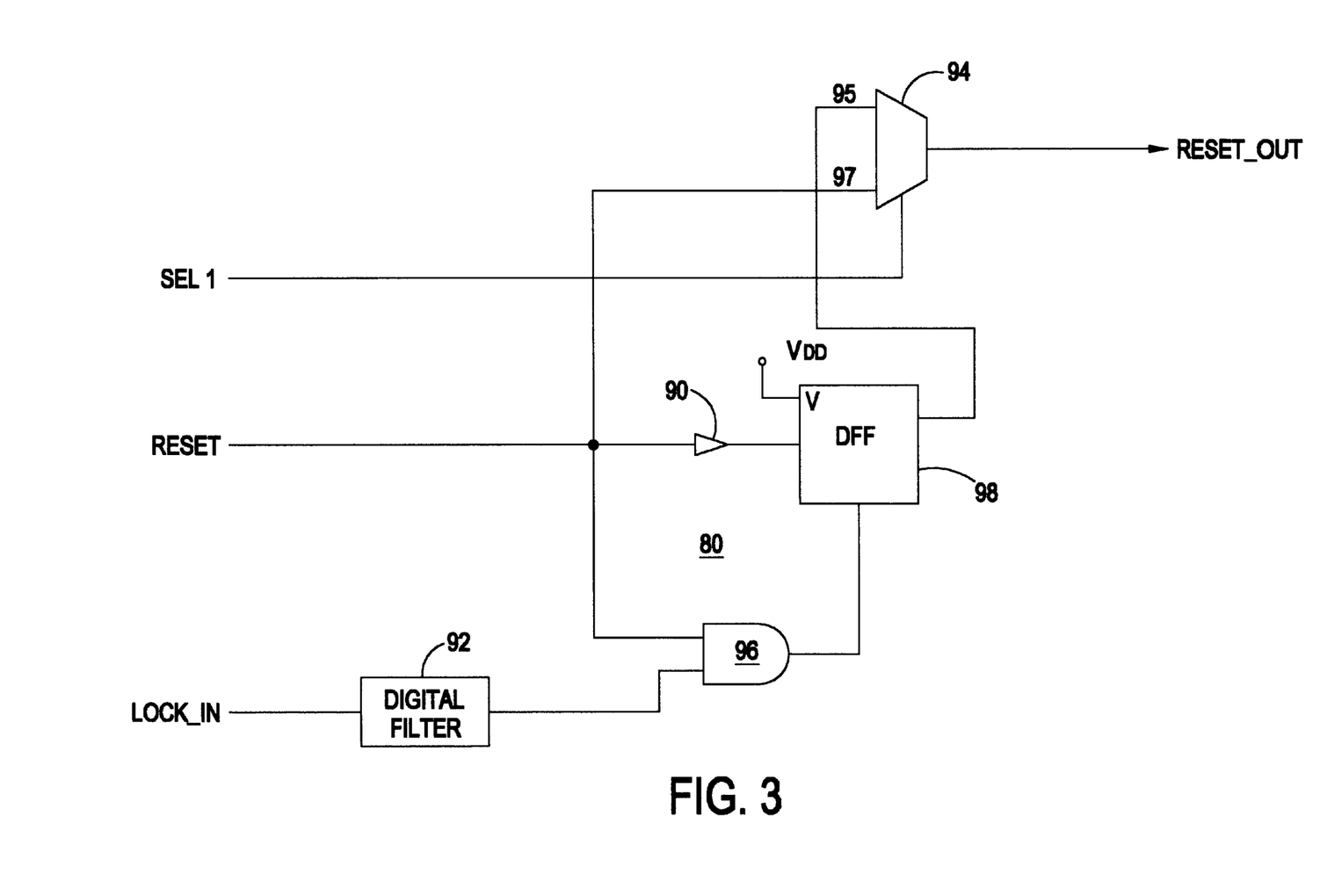
FIG. 3 is a schematic representation of a selected aspect of the circuit in FIG. 2.

FIG. 3 shows an example of a reset control circuit 80 according to a preferred embodiment of the present invention. The reset control circuit 80 includes a third multiplexer 94 a flip-flop 98, a driver 90 an AND-gate 96 and a digital filter 92. The first select input SEL1 triggers the third multiplexer 94 selecting either the first input 95 or the second input 97. The first input 95 is an output from the flip-flop 98. The flip-flop 98 receives the reset input from the driver 90 and uses the output of the AND-gate 96 to trigger the state of the reset input to the first input 95 of the third multiplexer 94. The inputs to the AND-gate 96 are the reset input and the lock signal from the output of the second multiplexer 70 in FIG. 2.

As shown in Table 1, setting the second select input SEL1 to logic '1' triggers the third multiplexer 94 to select the second input 97 which receives the reset signal from the master reset at connection 16 as shown in FIG. 2. By selecting the logic '1' at the second selection input SEL1, the reset control circuit 80 causes the reset output to follow the master reset signal as is desired during normal operation of the system. By setting the second select input SEL1 to a logic '0', the reset control circuit 80 uses the output of the flip-flop 98 as the reset output. The output of the flip-flop 98 does not generate a reset signal unless the lock input indicates that the frequency synthesizer 20 is in phase lock, such that the integrated circuit is held in reset until the locked state is reached. This prevents a false clocking of the integrated circuit 10 by the frequency synthesizer 20 during start up. Once the frequency synthesizer 20 has locked to its reference clock, the lock signal will transition to a logic '1', enabling the integrated circuit reset input to be coupled to the reset signal on the function circuit 12. This insures that simulation events may be repeated during the manufacturing test.

The digital filter in 92 is optional but advantageous to use to prevent false locks which may occur during the start up of the frequency synthesizer or by causing the integrated circuit 10 to come out of reset before it is desired.

It is to be understood by those of ordinary skill in the art that the testability circuit 50 shown in FIG. 2 and the reset control circuit 80 shown in FIG. 3 illustrate only one combination of gates, flip-flops, multiplexers and other combinational logic to insure the testability of the integrated circuit 10 during manufacturing and that other combinations are possible. It is further understood by those of ordinary skill in the art that the truth table shown in Table 1 illustrates only one example of the logic that may be used to insure the testability of the integrated circuit 10 during manufacturing. The logic '1' and '0' states may be implemented by any digital circuitry using a selected voltage for the one state and a selected alternative voltage for the logic '0' state.

Figure 4:
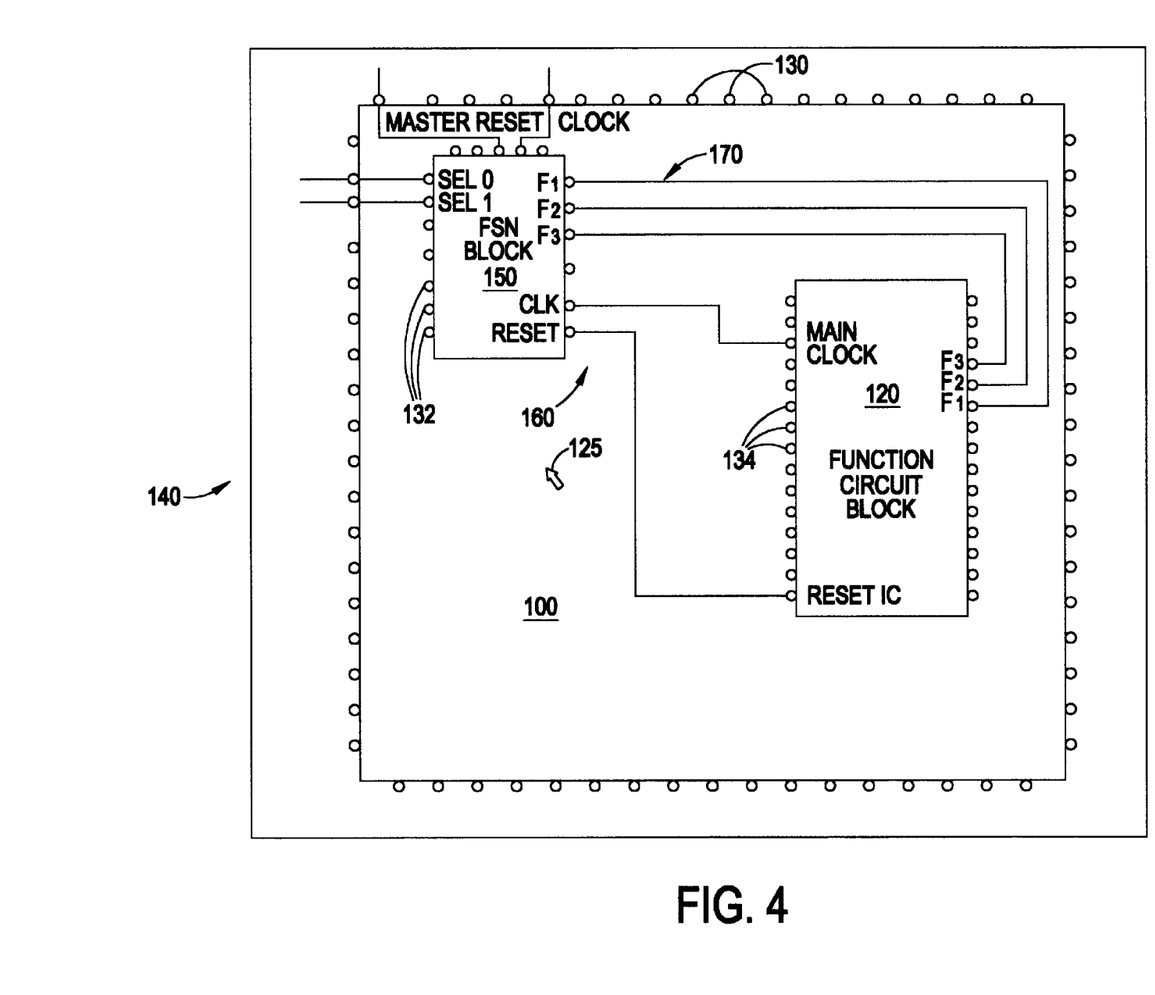
FIG. 4 is a pictorial representation of a workstation display screen showing a display for a computer based design tool of the type in which the present invention finds advantageous use.

According to preferred embodiments of the present invention, the circuits shown in FIGS. 1, 2 and 3 may be defined by cells in a computer based design tool. FIG. 4 shows a display 140 for a computer based designed tool in an integrated circuit design workstation. The display 140 shows a function block 100 representing the integrated circuit 10, a frequency synthesizer block 150 representing the frequency synthesizer 15 in FIG. 1 and a function circuit block 120 representing the function circuit 12 in FIG. 1. A designer may use the graphical user interface tools on the workstation to place the frequency synthesizer block 150 and the function circuit block 120 in any appropriate location on the integrated circuit design block 100. The designer may use the graphical user interface to manipulate a pointer 125 using well-known graphical user interface tools to make connections between predefined output pins or input pins between the frequency synthesizer block 150 and the function circuit block 120, as well as between the pins on the function blocks and the pins on the integrated circuit 100.

One advantage of preferred embodiments of the present invention is that the testability circuit 50 may include in the frequency synthesizer block 150 to insure testability during manufacture of the integrated circuit 10 any time the frequency synthesizer block 150 is used.

While the invention has been described in conjunction with presently preferred embodiments of the invention, persons of skill in the art will appreciate that variations may be made without departure from the scope and spirit of the invention. This true scope and spirit is defined by the appended claims, interpreted in light of the foregoing.

We claim:

1. An improved integrated circuit comprising a frequency synthesizer, a master reset input and a function circuit, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the master reset input being coupled to a reset signal source for receiving a master reset signal to initialize the integrated circuit, the function circuit comprising a function reset input for receiving a function reset signal, and a plurality of frequency inputs for receiving at least one of the plurality of output frequency signals from the frequency synthesizer, the improvement comprising:

a testability circuit having a test mode for testing the integrated circuit, the testability circuit comprising:
a reset input for receiving the master reset signal; and
a reset controller for coupling a reset out signal to the function reset input when in the test mode, when the frequency synthesizer generates the lock signal and when the master reset signal is received;
a select input for receiving a select signal, the select signal being operable to indicate an at-speed test mode such that the testability circuit is in the test mode and a system mode such that the integrated circuit is in a normal operating mode, wherein the reset controller couples, when the system mode is selected, the master reset signal to the function reset input, wherein the function circuit includes a clock input for receiving a clock out signal; and wherein:
the testability circuit includes:
a second select input for selecting a static test mode; and
a clock controller for generating the clock out signal, the clock signal being generated from one of the output frequency signals of the frequency synthesizer when the at-speed test mode and the system mode is selected, and from the reference frequency when the static test mode is selected.

2. An integrated circuit as claimed in claim 1 wherein the clock controller comprises:
a multiplexer to switch one of the output frequency signals to the clock input on the function circuit when the system mode and the at-speed mode is selected, and to switch the reference frequency to the clock input when the static test mode is selected.

3. An improved integrated circuit comprising a frequency synthesizer, a master reset input and a function circuit, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the master reset input being coupled to a reset signal source for receiving a master reset signal to initialize the integrated circuit, the function circuit comprising a function reset input for receiving a function reset signal, and a plurality of frequency inputs for receiving at least one of the plurality of output frequency signals from the frequency synthesizer, the improvement comprising:

a testability circuit having a test mode for testing the integrated circuit, the testability circuit comprising:
a reset input for receiving the master reset signal; and
a reset controller for coupling a reset out signal to the function reset input when in the test mode, when the frequency synthesizer generates the lock signal and when the master reset signal is received, wherein the reset controller comprises:
a reset triggering circuit having first input for the master reset and a second input for the lock signal, the reset triggering circuit being operable to switch the master reset to lock reset signal when the lock signal is received; and
a multiplexer for switching the master reset as the reset out signal when the system mode is selected and for switching the lock reset signal as the reset out signal when the at-speed test mode is selected.

4. An improved system for designing an integrated circuit comprising a plurality of design blocks, a plurality of design connections and a design block connector, the design blocks being computer representations for circuits having selected functions, the design connections being computer representations of conductor connections between the design blocks and of integrated circuit inputs and outputs, the design block connector comprising a user interface responsive to user commands to connect the design blocks to design the integrated circuit, at least one of the design blocks being a function block for representing a function circuit, another one of the design blocks being a frequency synthesizer block for representing a frequency synthesizer, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the design connections including a master reset signal to initialize the integrated circuit and a function reset input for resetting the function circuit, the improvement comprising:

a testability circuit having a test mode for testing the integrated circuit, the testability circuit comprising:
a reset input for receiving the master reset signal; and
a reset controller for coupling a reset out signal to the function reset input, when in the test mode, the frequency synthesizer generates the lock signal and the master reset signal is received;

wherein the integrated circuit designed by the user is manufactured from the connected design blocks and is testable when the integrated circuit includes the frequency synthesizer block, wherein the testability circuit further comprises:

a select input for receiving a select signal, the select signal being operable to indicate an at-speed test mode such that the testability circuit is in the test mode and a system mode such that the integrated circuit is in a normal operating mode, wherein the reset controller couples, when the system mode is selected, the master reset signal to the function reset input, and wherein:
the function circuit includes a clock input for receiving a clock signal; and wherein:
the testability circuit includes:
a second select input for selecting a static test mode; and
a clock controller for generating the clock signal, the clock signal being generated from one of the output frequency signals of the frequency synthesizer when the at-speed test mode and the system mode is selected, and from the reference frequency when the static test mode is selected.

5. An improved system for designing an integrated circuit comprising a plurality of design blocks, a plurality of design connections and a design block connector, the design blocks being computer representations for circuits having selected functions, the design connections being computer representations of conductor connections between the design blocks and of integrated circuit inputs and outputs, the design block connector comprising a user interface responsive to user commands to connect the design blocks to design the integrated circuit, at least one of the design blocks being a function block for representing a function circuit, another one of the design blocks being a frequency synthesizer block for representing a frequency synthesizer, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the design connections including a master reset signal to initialize the integrated circuit and a function reset input for resetting the function circuit, the improvement comprising:

a testability circuit having a test mode for testing the integrated circuit, the testability circuit comprising:
a reset input for receiving the master reset signal; and
a reset controller for coupling a reset out signal to the function reset input, when in the test mode, the frequency synthesizer generates the lock signal and the master reset signal is received;

wherein the integrated circuit designed by the user is manufactured from the connected design blocks and is testable when the integrated circuit includes the frequency synthesizer block wherein the testability circuit further comprises:

a select input for receiving a select signal, the select signal being operable to indicate an at-speed test mode such that the testability circuit is in the test mode and a system mode such that the integrated circuit is in a normal operating mode, wherein the reset controller couples, when the system mode is selected, the master reset signal to the function reset input, and wherein the clock controller comprises:
a multiplexer to switch one of the output frequency signals to the clock input on the function circuit when the system mode and the at-speed mode is selected, and to switch the reference frequency to the clock input when the static test mode is selected.

6. An improved system for designing an integrated circuit comprising a plurality of design blocks, a plurality of design connections and a design block connector, the design blocks being computer representations for circuits having selected functions, the design connections being computer representations of conductor connections between the design blocks and of integrated circuit inputs and outputs, the design block connector comprising a user interface responsive to user commands to connect the design blocks to design the integrated circuit, at least one of the design blocks being a function block for representing a function circuit, another one of the design blocks being a frequency synthesizer block for representing a frequency synthesizer, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the design connections including a master reset signal to initialize the integrated circuit and a function reset input for resetting the function circuit, the improvement comprising:

a testability circuit having a test mode for testing the integrated circuit, the testability circuit comprising:
a reset input for receiving the master reset signal; and
a reset controller for coupling a reset out signal to the function reset input, when in the test mode, the frequency synthesizer generates the lock signal and the master reset signal is received;

wherein the integrated circuit designed by the user is manufactured from the connected design blocks and is testable when the integrated circuit includes the frequency synthesizer block, wherein the reset controller comprises:
a reset triggering circuit having first input for the master reset and a second input for the lock signal, the reset triggering circuit being operable to switch the master reset to a lock reset signal when the lock signal is received; and
a multiplexer for switching the master reset as the reset out signal when the system mode is selected and for switching the lock reset signal as the reset out signal when the at-speed mode is selected.

7. A method for ensuring testability of an integrated circuit comprising a function circuit for performing integrated circuit functions and a frequency synthesizer for generating at least one operating frequency used by the function circuit, the method comprising the steps of:

coupling a testability circuit to a frequency synthesizer by
the steps of:
coupling a lock signal output from the frequency synthesizer to the testability circuit for communicating a lock signal to the testability circuit, the lock signal indicating a phase lock in the frequency synthesizer;
coupling an operating frequency output to the testability circuit; and
coupling a reference frequency input to the frequency synthesizer and to the testability circuit;
coupling a master reset signal input for receiving a master reset signal that resets the integrated circuit to the testability circuit;
coupling a clock signal output from the testability circuit to the function circuit;
coupling a reset output from the testability circuit to the function circuit; and
coupling a mode selector to select a test mode, the test mode being operable to permit testing of the integrated circuit by inhibiting the reset signal from the reset output until the lock signal is received from the frequency synthesizer and the master reset signal is received at the master reset signal input, wherein the step of coupling the mode selector further comprises the steps of:
switching a first multiplexer to receive the operating frequency from the frequency synthesizer;
switching a second multiplexer to receive a lock signal from the frequency synthesizer; and
triggering a reset controller to couple the reset signal to the function circuit when the master reset signal and the lock signal are received.

8. An integrated circuit comprising a frequency synthesizer, a master reset input and a function circuit, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the master reset input being coupled to a reset signal source for receiving a master reset signal to initialize the integrated circuit, the function circuit comprising a function reset input for receiving a function reset signal, and a plurality of frequency inputs for receiving at least one of the plurality of output frequency signals from the frequency synthesizer, said integrated circuit including a testability circuit having a test mode for testing the integrated circuit, said testability circuit configured to couple a reset out signal to the function reset input when in the test mode, when the frequency synthesizer generates the lock signal and when the master reset signal is received, said testability circuit configured to receive a select signal operable to indicate an at-speed test mode such that the testability circuit is in the test mode and a system mode such that the integrated circuit is in a normal operating mode, wherein the testability circuit couples, when the system mode is selected, the master reset signal to the function reset input, wherein the function circuit includes a clock input for receiving a clock out signal; and wherein the testability circuit includes a second select input for selecting a static test mode and is configured to generate the clock out signal, the clock signal being generated from one of the output frequency signals of the frequency synthesizer when the at-speed test mode and the system mode is selected, and from the reference frequency when the static test mode is selected.

9. An integrated circuit as claimed in claim 8, wherein said testability circuit is configured to switch one of the output frequency signals to the clock input on the function circuit when the system mode and the at-speed mode is selected, and to switch the reference frequency to the clock input when the static test mode is selected.

10. An integrated circuit comprising a frequency synthesizer, a master reset input and a function circuit, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the master reset input being coupled to a reset signal source for receiving a master reset signal to initialize the integrated circuit, the function circuit comprising a function reset input for receiving a function reset signal, and a plurality of frequency inputs for receiving at least one of the plurality of output frequency signals from the frequency synthesizer, said integrated circuit including a testability circuit having a test mode for testing the integrated circuit, the testability circuit configured to couple a reset out signal to the function reset input when in the test mode, when the frequency synthesizer generates the lock signal and when the master reset signal is received, said testability circuit configured to selectively operate in a system mode and an at-speed test mode, said testability circuit configured to switch the master reset to lock reset signal when the lock signal is received and configured to switch the master reset as the reset out signal when the system mode is selected, said testability circuit configured to switch the lock reset signal as the reset out signal when the at-speed test mode is selected.

11. A system for designing an integrated circuit comprising a plurality of design blocks, a plurality of design connections and a design block connector, the design blocks being computer representations for circuits having selected functions, the design connections being computer representations of conductor connections between the design blocks and of integrated circuit inputs and outputs, the design block connector comprising a user interface responsive to user commands to connect the design blocks to design the integrated circuit, at least one of the design blocks being a function block for representing a function circuit, another one of the design blocks being a frequency synthesizer block for representing a frequency synthesizer, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the design connections including a master reset signal to initialize the integrated circuit and a function reset input for resetting the function circuit, said system including a testability circuit having a test mode for testing the integrated circuit, the testability circuit configured to receive the master reset signal and couple a reset out signal to the function reset input, when in the test mode, the frequency synthesizer generates the lock signal and the master reset signal is received, wherein the integrated circuit designed by the user is manufactured from the connected design blocks and is testable when the integrated circuit includes the frequency synthesizer block, said testability circuit configured to receive a select signal operable to indicate an at-speed test mode such that the testability circuit is in the test mode and a system mode such that the integrated circuit is in a normal operating mode, wherein the testability circuit couples, when the system mode is selected, the master reset signal to the function reset input, wherein the function circuit is configured to receive a clock signal and the testability circuit includes a second select input for selecting a static test mode and is configured to generate the clock signal from one of the output frequency signals of the frequency synthesizer when the at-speed test mode and the system mode is selected, and from the reference frequency when the static test mode is selected.

12. A system for designing an integrated circuit comprising a plurality of design blocks, a plurality of design connections and a design block connector, the design blocks being computer representations for circuits having selected functions, the design connections being computer representations of conductor connections between the design blocks and of integrated circuit inputs and outputs, the design block connector comprising a user interface responsive to user commands to connect the design blocks to design the integrated circuit, at least one of the design blocks being a function block for representing a function circuit, another one of the design blocks being a frequency synthesizer block for representing a frequency synthesizer, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the design connections including a master reset signal to initialize the integrated circuit and a function reset input for resetting the function circuit, the system including a testability circuit having a test mode for testing the integrated circuit, the testability circuit configured to receive the master reset signal and configured to couple a reset out signal to the function reset input, when in the test mode, the frequency synthesizer generates the lock signal and the master reset signal is received, wherein the integrated circuit designed by the user is manufactured from the connected design blocks and is testable when the integrated circuit includes the frequency synthesizer block, wherein the testability circuit is configured to receive a select signal operable to indicate an at-speed test mode such that the testability circuit is in the test mode and a system mode such that the integrated circuit is in a normal operating mode, wherein the reset controller couples, when the system mode is selected, the master reset signal to the function reset input, and wherein the testability circuit is configured to switch one of the output frequency signals to the clock input on the function circuit when the system mode and the at-speed mode is selected, and to switch the reference frequency to the clock input when the static test mode is selected.

13. A system for designing an integrated circuit comprising a plurality of design blocks, a plurality of design connections and a design block connector, the design blocks being computer representations for circuits having selected functions, the design connections being computer representations of conductor connections between the design blocks and of integrated circuit inputs and outputs, the design block connector comprising a user interface responsive to user commands to connect the design blocks to design the integrated circuit, at least one of the design blocks being a function block for representing a function circuit, another one of the design blocks being a frequency synthesizer block for representing a frequency synthesizer, the frequency synthesizer comprising a plurality of frequency outputs for outputting a plurality of output frequency signals generated from a reference frequency at a reference frequency input, the frequency synthesizer being operable to generate a lock signal to indicate that one of the output frequency signals is synchronous to the reference frequency, the design connections including a master reset signal to initialize the integrated circuit and a function reset input for resetting the function circuit, the system including a testability circuit having a test mode for testing the integrated circuit, the testability circuit configured to receive the master reset signal and couple a reset out signal to the function reset input, when in the test mode, the frequency synthesizer generates the lock signal and the master reset signal is received;

wherein the integrated circuit designed by the user is manufactured from the connected design blocks and is testable when the integrated circuit includes the frequency synthesizer block, wherein the testability circuit is configured to receive the master reset and the lock signal and is operable to switch the master reset to a lock reset signal when the lock signal is received and is configured to switch the master reset as the reset out signal when the system mode is selected and for switching the lock reset signal as the reset out signal when the at-speed mode is selected.

14. A method for ensuring testability of an integrated circuit comprising a function circuit for performing integrated circuit functions and a frequency synthesizer for generating at least one operating frequency used by the function circuit, the method comprising the steps of:

coupling a testability circuit to a frequency synthesizer by the steps of:
coupling a lock signal output from the frequency synthesizer to the testability circuit for communicating a lock signal to the testability circuit, the lock signal indicating a phase lock in the frequency synthesizer;
coupling an operating frequency output to the testability circuit; and
coupling a reference frequency input to the frequency synthesizer and to the testability circuit;
coupling a master reset signal input for receiving a master reset signal that resets the integrated circuit to the testability circuit;
coupling a clock signal output from the testability circuit to the function circuit;
coupling a reset output from the testability circuit to the function circuit; and
coupling a mode selector to select a test mode, the test mode being operable to permit testing of the integrated circuit by inhibiting the reset signal from the reset output until the lock signal is received from the frequency synthesizer and the master reset signal is received at the master reset signal input, wherein the step of coupling the mode selector further comprises the steps of:
receiving the operating frequency from the frequency synthesizer;
receiving a lock signal from the frequency synthesizer; and
coupling the reset signal to the function circuit when the master reset signal and the lock signal are received.

* * * * *